US011600987B2

(12) United States Patent
Lee

(10) Patent No.: US 11,600,987 B2
(45) Date of Patent: Mar. 7, 2023

(54) SMART EARTH LEAKAGE CIRCUIT BREAKER

(71) Applicant: ITS CO., LTD., Ulsan (KR)

(72) Inventor: Young Kyu Lee, Ulsan (KR)

(73) Assignee: ITS CO., LTD., Ulsan (KR)

( * ) Notice: Subject to any disclaimer, the term of this patent is extended or adjusted under 35 U.S.C. 154(b) by 0 days.

(21) Appl. No.: 17/831,831

(22) Filed: Jun. 3, 2022

(65) Prior Publication Data

US 2022/0302696 A1 Sep. 22, 2022

Related U.S. Application Data

(63) Continuation of application No. PCT/KR2020/017522, filed on Dec. 3, 2020.

(30) Foreign Application Priority Data

Dec. 5, 2019 (KR) ........................ 10-2019-0161116

(51) Int. Cl.
*H02H 3/00* (2006.01)
*H02H 3/16* (2006.01)
*H02H 1/00* (2006.01)

(52) U.S. Cl.
CPC ............ *H02H 3/16* (2013.01); *H02H 1/0007* (2013.01)

(58) Field of Classification Search
None
See application file for complete search history.

(56) References Cited

U.S. PATENT DOCUMENTS 6,104,795 A * 8/2000 Akhteruzzaman .... H04M 17/02 379/147
6,744,301 B1 * 6/2004 Tschanz .................. G05F 3/205 327/537
11,307,265 B2 4/2022 Yoon et al.
2017/0025842 A1 * 1/2017 Peterson .................. H02H 3/33
2020/0408825 A1 * 12/2020 Johnson ................. G01R 31/42
2021/0002170 A1 * 1/2021 Chien ................... C03B 27/012
2021/0035764 A1 2/2021 Yoon et al.

FOREIGN PATENT DOCUMENTS

JP H04111140 U 9/1992
KR 100543891 B1 1/2006
KR 100755955 B1 9/2007
KR 102008472 B1 8/2019
WO 2019190018 A1 10/2019

* cited by examiner

*Primary Examiner* — Stephen W Jackson
(74) *Attorney, Agent, or Firm* — Lempia Summerfield Katz LLC

(57) ABSTRACT

A smart earth leakage circuit breaker is installed on a distribution line through which an electric current flows. The breaker measures, by means of a CT, a leakage current flowing through the distribution line, and if the measured current exceeds a preset rated sensitivity current, cuts off electricity by means of trip operation. The smart earth leakage circuit breaker further comprises: a measurement unit tracking and measuring, based on measurement information of the CT, a value of the leakage current exceeding an alarm current value; the MPU setting conditionality and the alarm current value less than the rated sensitivity current and when the conditionality is satisfied based on information measured by the measurement unit, issuing a warning by means of an alarm unit; and the alarm unit operated and controlled by the MPU and warning of an abnormal symptom of the distribution line.

1 Claim, 5 Drawing Sheets

SMART EARTH LEAKAGE CIRCUIT BREAKER

CROSS-REFERENCE TO RELATED APPLICATIONS

Figure 1:
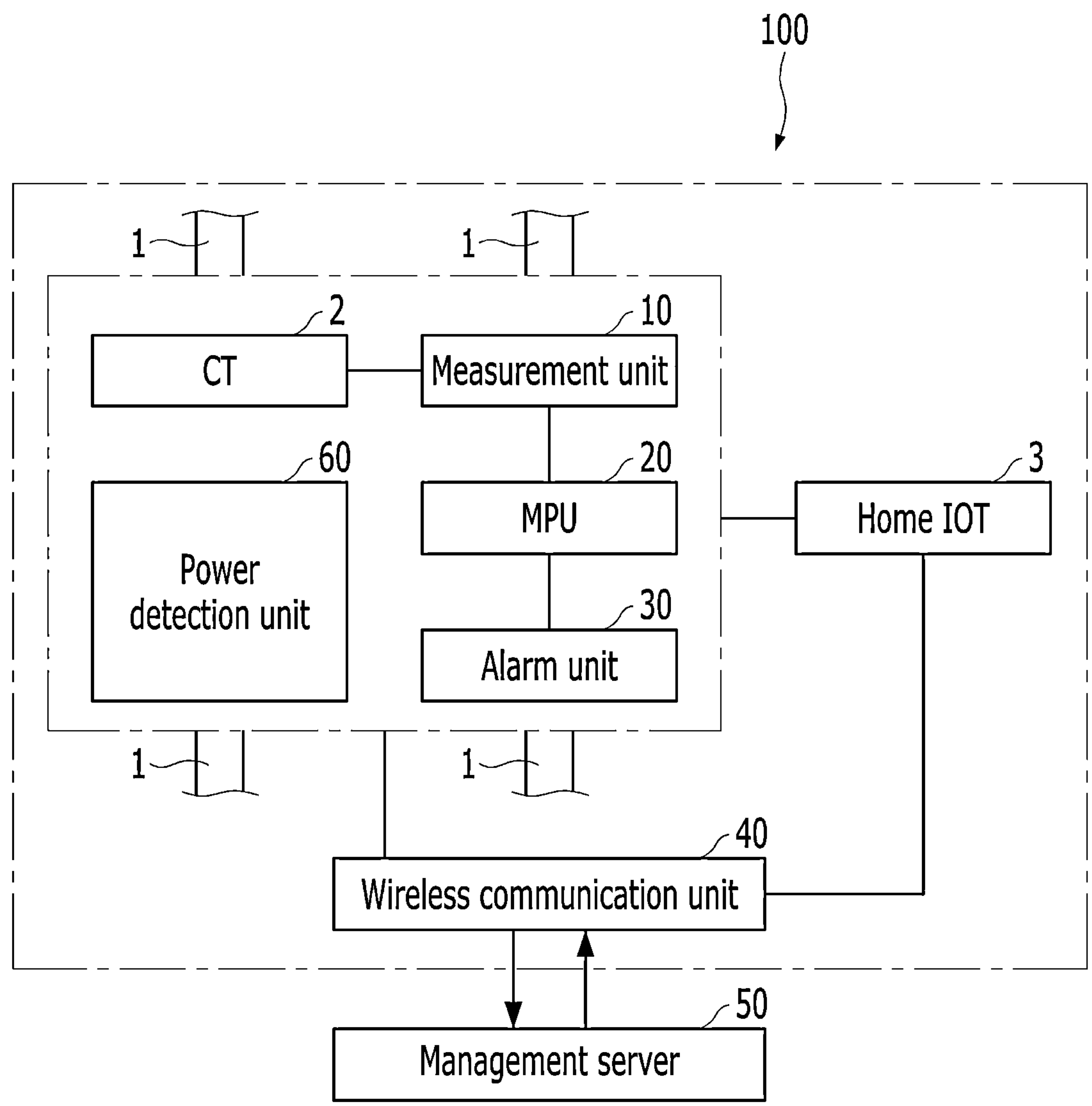

This application is a continuation of International Patent Application No. PCT/KR2020/017522, filed Dec. 3, 2020, which claims priority to Korean Patent Application 10-2019-0161116, filed Dec. 5, 2019, the entirety of each of which is incorporated herein by reference.

FIELD

The present disclosure relates to a smart earth leakage circuit breaker. More particularly, the present disclosure relates to a smart earth leakage circuit breaker capable of very effectively preventing safety accidents caused by a leakage current.

BACKGROUND

The statements in this section merely provide background information related to the present disclosure and may not constitute prior art.

In the smart earth leakage circuit breaker, a microprocessor issues a warning to the surrounding area by means of an alarm unit if set conditionality is satisfied based on detection information. The detection information tracks, by means of a measurement unit, a leakage current, which exceeds an alarm current value, based on measurement information of a current transformer (CT). Thus, the smart earth leakage circuit breaker may detect in advance an abnormal symptom of a distribution line through a leakage current less than a rated sensitivity current value generated on the distribution line and may manage and deal with the detected abnormal symptom.

In a generally known state of fire occurrence in Korea, 30,000 or more of fires occur every year, and electric fires are frequent so that 30% or more of fires are known as fires caused by electricity. Since the occurrence of these electric fires causes enormous property damage and human casualty, a fire prevention system has always been urgently required.

Meanwhile, until recently, the most active fire prevention measure in Korea was to install an earth leakage circuit breaker to prevent fires caused by short circuits or earth leakage, which is a main cause of electric fires. However, a conventional earth leakage circuit breaker blocks electricity by a trip operation only when an excessive current exceeding a predetermined rated sensitivity current (e.g., 30 mA) flows to prevent safety accidents caused by earth leakage. As a result, since the conventional earth leakage circuit breaker cannot detect in advance a phenomenon caused by a leakage current below the rated sensitivity current before the occurrence of safety accidents caused by earth leakage, there was a problem that it was not possible to effectively prevent safety accidents caused by earth leakage.

SUMMARY

The present disclosure provides a smart earth leakage circuit breaker capable of very effectively preventing safety accidents caused by a leakage current. In the smart earth leakage circuit breaker, a microprocessor issues a warning to the surrounding area by means of an alarm unit if set conditionality is satisfied based on detection information. The detection information tracks, by means of a measurement unit, a leakage current, which exceeds an alarm current value, based on measurement information of a current transformer (CT). Thus, the smart earth leakage circuit breaker may detect in advance an abnormal symptom of a distribution line through a leakage current less than a rated sensitivity current value generated on the distribution line and may manage and deal with the detected abnormal symptom.

The present disclosure also provides a smart earth leakage circuit breaker capable of completely preventing or inhibiting safety accidents caused by a leakage current. In the smart earth leakage circuit breaker, an alarm unit issues a warning by transmitting an alarm and alarm information to a mobile phone set by means of a home Internet of Things (IoT) installed at home to not only induce a rapid management response of a distribution line but also perform a trip operation by a remote control of the home IoT by means of a management server.

In addition, the present disclosure provides a smart earth leakage circuit breaker capable of inducing an earth leakage circuit breaker installed at each home to more effectively detect an abnormal symptom of a distribution line through conditionality. In the smart earth leakage circuit breaker, a management server collects and learns big data based on the detection information collected and transmitted from earth leakage circuit breakers installed in a plurality of homes. The management server also sets appropriate conditionality in response to the amount of power used in the distribution line of each home based on the learned information and provides the set conditionality to the microprocessor.

An aspect of present disclosure provides a smart earth leakage circuit breaker, installed on a distribution line through which an electric current flows. The smart earth leakage circuit breaker measures, by means of a current transformer (CT), a leakage current flowing through the distribution line and if the measured current exceeds a preset rated sensitivity current, cuts off electricity by means of trip operation. The smart earth leakage circuit breaker includes a measurement unit, which tracks and measures, based on measurement information of the CT, a value of the leakage current, flowing through the distribution line. The value of the leakage current exceeds an alarm current value set by a microprocessor (MPU). The smart earth leakage circuit breaker also includes the MPU, which sets conditionality and the alarm current value less than the rated sensitivity current, and which when the conditionality is satisfied, based on information measured by the measurement unit, issues a warning by means of an alarm unit. The smart earth leakage circuit breaker also includes the alarm unit, which is operated and controlled by the MPU and warns of an abnormal symptom of the distribution line by emitting an alarm to the surrounding area. The conditionality set in the MPU includes a threshold number of the number of times when the leakage current exceeds the alarm current value through the measurement information of the measurement unit or includes the threshold number and a unit detection period for tracking the threshold number.

Further, if the set conditionality is satisfied, the MPU may transmit alarm information to a home Internet of Things (IoT) through wired/wireless communication to issue a warning to the surrounding area by means of the home IoT and the home IoT may transmit the alarm information to a set phone number input through Wi-Fi.

Further, the smart earth leakage circuit breaker may be configured to further include a two-way wireless communication unit that collects measurement information measured by the measurement unit and transmits the collected measurement information to a management server. The smart earth leakage circuit breaker may be configured to further include the management server that remotely controls and performs a trip operation of the smart earth leakage circuit breaker if the measurement information transmitted from the wireless communication unit satisfies the conditionality set in the smart earth leakage circuit breaker a preset number of times or more.

Further, the smart earth leakage circuit breaker may include a power detection unit that detects the amount of power used by means of the distribution line and transmits the detection information to the management server by means of the wireless communication unit. The management server may learn a large amount of measurement information transmitted from a plurality of smart earth leakage circuit breaker into big data. The management server may set conditionality suitable for the amount of power used in the distribution line of each smart earth leakage circuit breaker. The management server may transmit the set conditionality to the MPU by means of the wireless communication unit so that the conditionality is automatically set in the MPU. The management server may variably set and transmit the conditionality based on the amount of power used in the distribution line of the smart earth leakage circuit breaker at unit time intervals.

According to the present disclosure, in a smart earth leakage circuit breaker, a microprocessor issues a warning to the surrounding area by means of an alarm unit if set conditionality is satisfied based on detection information that tracks. The microprocessor also issues, by means of a measurement unit, a leakage current, which exceeds an alarm current value, based on measurement information of a CT. Thus, the smart earth leakage circuit breaker may detect in advance an abnormal symptom of a distribution line through a leakage current less than a rated sensitivity current value generated on the distribution line and may manage and deal with the detected abnormal symptom, so that it is possible to effectively prevent safety accidents caused by a leakage current.

Further, an alarm unit issues a warning by transmitting an alarm and alarm information to a mobile phone set by means of a home Internet of Things (IoT) installed at home to not only induce a rapid management response of a distribution line but also perform a trip operation by a remote control of the home IoT by means of a management server. Thus, it is possible to completely prevent safety accidents caused by a leakage current.

Further, a management server collects and learns big data based on the detection information collected and transmitted from earth leakage circuit breakers installed in a plurality of homes. The management server also sets appropriate conditionality in response to the amount of power used in the distribution line of each home based on the learned information and provides the set conditionality to the microprocessor. Thus, it is possible to induce an earth leakage circuit breaker installed at each home to more effectively detect an abnormal symptom of a distribution line through conditionality.

DRAWINGS

In order that the disclosure may be well understood, there will now be described various forms thereof, given by way of example, reference being made to the accompanying drawings, in which:

FIG. 1 is a schematic diagram of a smart earth leakage circuit breaker according to an embodiment of the present disclosure; and FIGS. 2-5 are diagrams for describing an operation of the smart earth leakage circuit breaker of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure relates to a smart earth leakage circuit breaker, which is installed on a distribution line through which an electric current flows. The smart earth leakage circuit breaker measures, by means of a current transformer (CT) 2, a leakage current flowing through the distribution line. If the measured current exceeds a preset rated sensitivity current, the smart earth leakage circuit breaker cuts off electricity by means of trip operation. The smart earth leakage circuit breaker includes a measurement unit, which tracks and measures, based on measurement information of the CT, a value of the leakage current, flowing through the distribution line and exceeding an alarm current value set by a microprocessor. The smart earth leakage circuit breaker also includes the microprocessor, which sets conditionality and the alarm current value less than the rated sensitivity current. When the conditionality is satisfied based on information measured by the measurement unit, the microprocessor issues a warning by means of an alarm unit. The smart earth leakage circuit breaker also includes the alarm unit, which is operated and controlled by the microprocessor and warns of an abnormal symptom of the distribution line by emitting an alarm to the surrounding area. The conditionality set in the microprocessor includes a threshold number of the number of times when the leakage current exceeds the alarm current value through the measurement information of the measurement unit or includes the threshold number and a unit detection period for tracking the threshold number.

A smart earth leakage circuit breaker according to an embodiment of the present disclosure is described in detail with reference to the accompanying drawings. The detailed description of publicly-known function and configuration that may make the gist of the present disclosure unnecessarily ambiguous has been omitted.

FIGS. 1-5 illustrate a smart earth leakage circuit breaker according to an embodiment of the present disclosure. FIG. 1 is a schematic diagram of a smart earth leakage circuit breaker according to an embodiment of the present disclosure. FIGS. 2-5 are diagrams for describing an operation of the smart earth leakage circuit breaker of the present disclosure, respectively.

As illustrated in the drawings, a smart earth leakage circuit breaker 100 according to the embodiment of the present disclosure is installed on a distribution line 1 through which an electric current flows. The smart earth leakage circuit breaker 100 measures, by means of a current transformer (CT) 2, a leakage current flowing through the distribution line. If the measured current exceeds a preset rated sensitivity current, the smart earth leakage circuit breaker 100 cuts off electricity by means of trip operation.

The smart earth leakage circuit breaker 100 further includes a measurement unit 10, a microprocessor (MPU) 20, and an alarm unit 30.

As illustrated in FIG. 1, the measurement unit 10 tracks and measures a value of the leakage current, flowing through the distribution line 1. The value of the leakage current exceeds an alarm current value set by the MPU 20 to be described below, based on measurement information of the CT 2.

Figure 2:
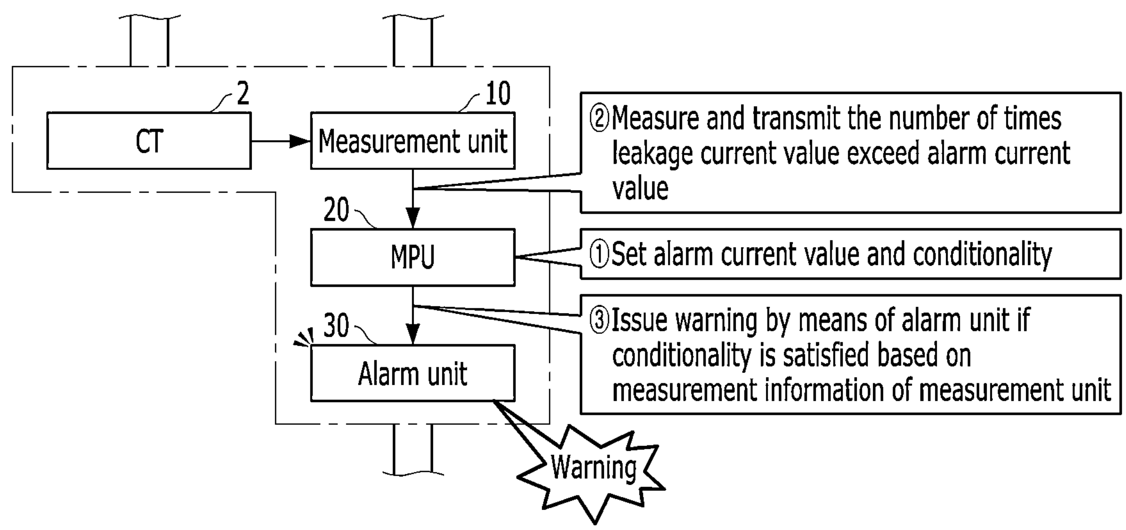

In other words, as illustrated in FIG. 2, in order to detect the abnormal symptom of the distribution line 1, the MPU 20 sets an alarm current value less than the rated sensitivity current value and the measurement unit 10 tracks and measures a leakage current flowing through the distribution line 1 and exceeding the set alarm current value based on the measurement information of the CT 2.

The measurement information measured by the measurement unit 10 is transmitted to the MPU 20 and used as information that detects the abnormal symptom of the distribution line.

As illustrated in FIG. 1, the MPU 20 sets conditionality and an alarm current value less than the rated sensitivity current value and issues a warning by means of the alarm unit 30 to be described below if the conditionality is satisfied based on the information measured by the measurement unit 10.

Here, the alarm current value is a threshold value for detecting the abnormal symptom of the distribution line 1 based on a leakage current less than the rated sensitivity current value that may be generated on the distribution line 1. The alarm current value may be set as various values in consideration of an installation environment, conditions, and the like where the earth leakage circuit breaker is installed.

In other words, as illustrated in FIG. 2, the MPU 20 sets the conditionality based on the alarm current value, issues a warning if the set conditionality is satisfied, and detects and alarms the abnormal symptom of the distribution line 1. The conditionality set in the MPU 20 may include a threshold number of the number of times when the leakage current exceeds the alarm current value through the measurement information of the measurement unit 10 or includes the threshold number and a unit detection period for tracking the threshold number.

As an example, when the threshold number is set to 5 times as the conditionality, if the number of times when the value of the leakage current on the distribution line 1 through the measurement information of the measurement unit 10 exceeds the alarm current value is detected 5 times or higher, the MPU 20 issues a warning by means of the alarm unit 30.

As another example, when the threshold number is set to 3 times as the conditionality and the unit detection period is set to 5 days, if the number of times when the value of the leakage current on the distribution line 1 through the measurement information of the measurement unit 10 exceeds the alarm current value is detected 3 times or higher within 5 days, the MPU 20 issues a warning. However, if the leakage current value of the distribution line 1 exceeds the alarm current value 1 or 2 times within 5 days, the MPU 20 does not issue the warning.

Here, it goes without saying that the conditionality may be set to various conditions in consideration of conditions such as power consumption, an installation environment, etc. of the distribution line in which the earth leakage circuit breaker is installed.

The abnormal symptom of the distribution line 1 through the leakage current less than the rated sensitivity current value generated on the distribution line 1 may be detected in advance in the same manner as described above. Thus, safety accidents such as fires caused by the leakage current of the distribution line 1 may be easily prevented.

As illustrated in FIG. 1, the alarm unit 30 is operated and controlled by means of the MPU 20 and generates an alarm to the surrounding area to alarm the abnormal symptom of the distribution line 1. Thus, rapid check and management of the distribution line 1 is induced.

Figure 3:
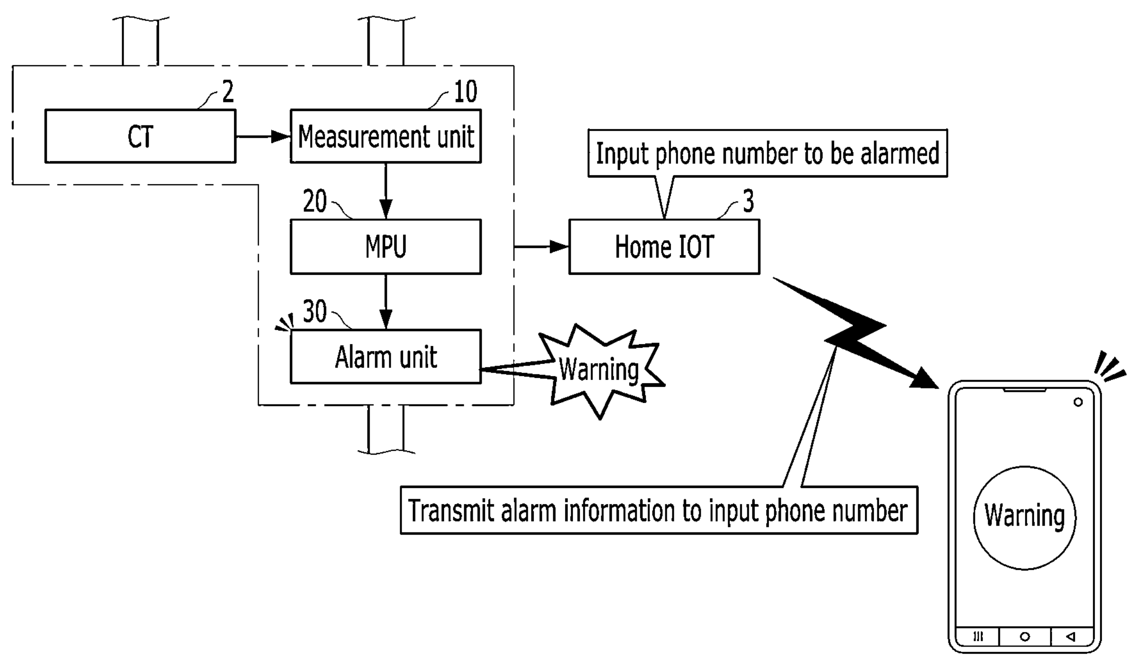
Figure 4:
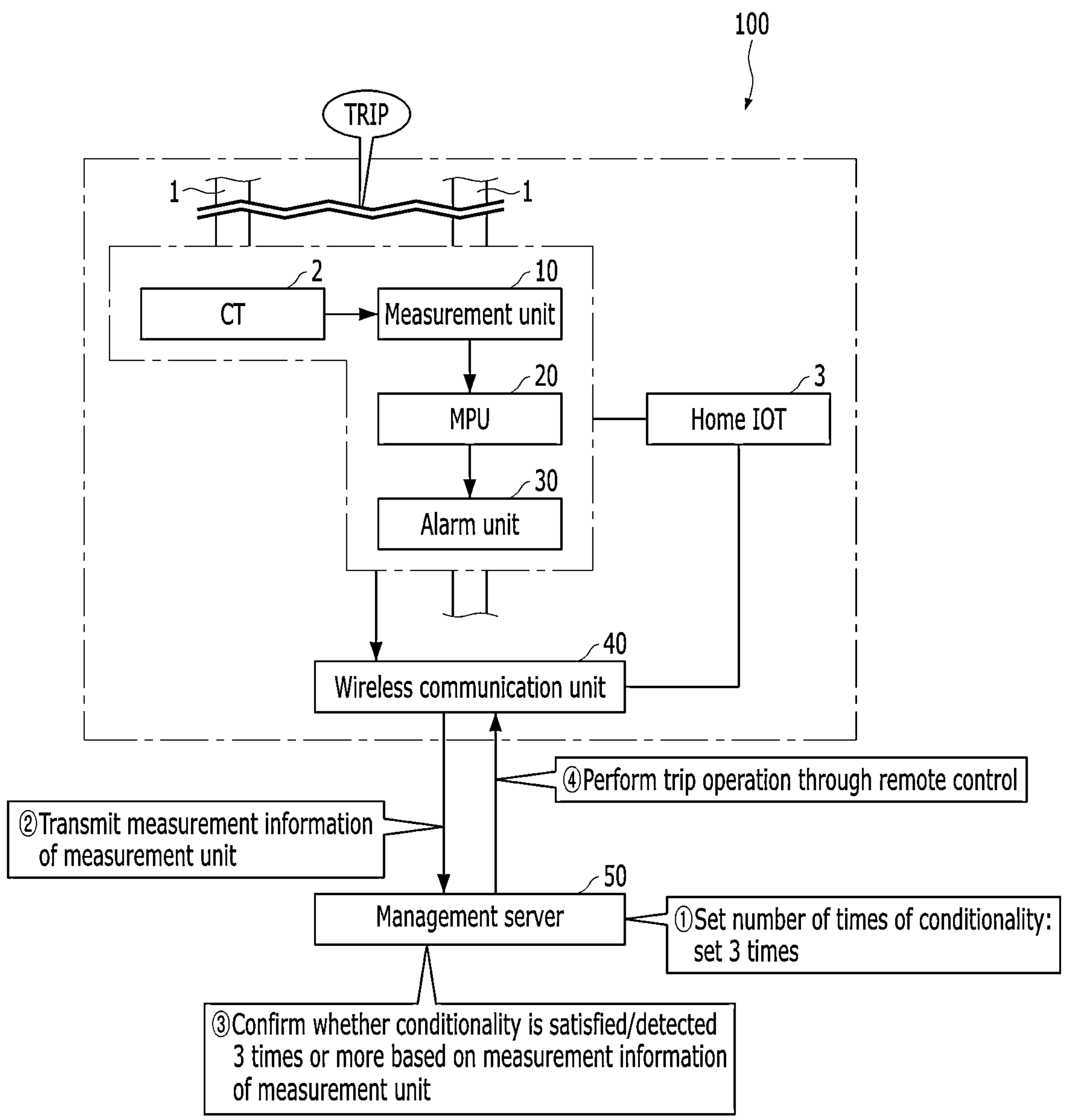

Here, when the set conditionality is satisfied, as illustrated in FIGS. 2 and 3, the MPU 20 transmits the alarm information to the home Internet of Things (IoT) 3 together with the alarm of the alarm unit 30 through wired/wireless communication to issue the warning to the surrounding area by means of the home IoT 3.

At this time, as illustrated in FIG. 3, the home IoT 3 transmits the alarm information to a preset phone number input through Wi-Fi to alarm the abnormal symptoms of the distribution line 1.

Recently, there is a trend to control the operation of home appliances and the like by means of the home IoT 3 built in the home using a smartphone (mobile phone), and it is possible to induce a rapid response through more efficient alarm by using such a home IoT 3.

Meanwhile, as illustrated in FIGS. 1-4, the smart earth leakage circuit breaker is configured to further include a two-way wireless communication unit 40 that collects measurement information measured by the measurement unit 10 and transmits the collected measurement information to a management server 50. The smart earth leakage circuit breaker is configured to further include the management server 50 that remotely controls and performs a trip operation of the smart earth leakage circuit breaker 100 if the number of times when the measurement information transmitted from the wireless communication unit 40 satisfies the conditionality set in the smart earth leakage circuit breaker 100 is equal to or more than a preset number of times.

Here, an object of the management server 50 is to prevent safety accidents caused by the leakage current by forcibly performing the trip operation of the smart earth leakage circuit breaker 100 through a remote control when the conditionality is repeatedly satisfied because an action of rapid repair/exchange of the distribution line 1 is not performed although the measurement information measured and collected by the measurement unit 10 of the smart earth leakage circuit breaker 100 installed at home satisfies the set conditionality.

Accordingly, it is desirable that the number of times set in the management server 50 is set at least twice. In the smart earth leakage circuit breaker 100 of the present disclosure, if the number of times is set to 3 times and the measurement information measured and collected by the smart earth leakage circuit breaker 100 satisfies 3 times by repeating the conditionality, the management server 50 remotely controls the smart earth leakage circuit breaker 100, but of course, the setting is not limited to such a number of times.

Here, the management server 50 may directly control the MPU 20 remotely or may control the MPU 20 by means of the home IoT 3.

In addition, as illustrated in FIG. 1, the smart earth leakage circuit breaker 100 includes a power detection unit 60 that detects the amount of power used by means of the distribution line 1 and transmits the detection information to the management server 50 by means of the wireless communication unit 40.

The management server 50 learns a large amount of measurement information transmitted from a plurality of smart earth leakage circuit breaker 100 into big data, sets conditionality suitable for the amount of power used in the distribution line 1 of each smart earth leakage circuit breaker 100, and transmits the set conditionality to the MPU 20 by means of the wireless communication unit 40 so that the conditionality is automatically set in the MPU 20, and The management server 50 variably sets and transmits the conditionality based on the amount of power used in the distribution line 1 of the smart earth leakage circuit breaker 100 at unit time intervals.

Figure 5:
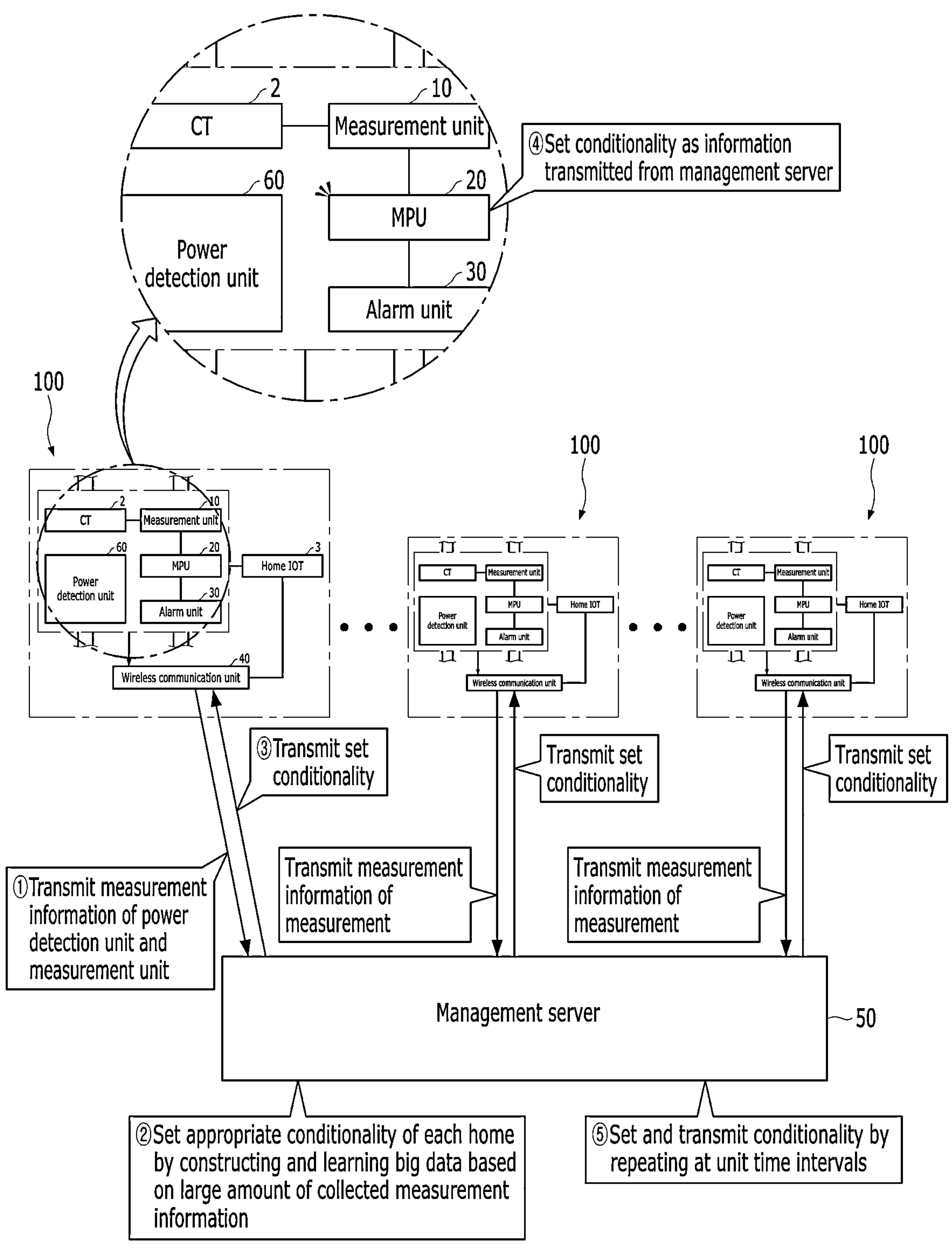

In other words, as illustrated in FIG. 5, the management server 50 collects a large amount of measurement information from the smart earth leakage circuit breakers 100 installed in each home. The management server 50 learns the measurement information into big data to set appropriate conditionality based on the amount of power used in each home and provide the set conditionality to the smart earth leakage circuit breaker 100 of each home. Thus, the abnormal symptom of the distribution line 1 may be more effectively detected by means of the smart earth leakage circuit breaker 100 installed in each home.

Moreover, the management server 50 variably sets and provides appropriate conditionality based on the amount of power used in the distribution line 1 of the smart earth leakage circuit breaker 1 successively at a unit time interval. Thus, safety accidents caused by a leakage current may be effectively and safely prevented by means of the smart earth leakage circuit breaker 100 installed at home.

Here, the unit time interval may be freely set and managed from a few minutes to months and years.

As an example, the smart earth leakage circuit breaker 100 of the present disclosure may effectively and precisely detect the abnormal symptom of the distribution line 1 of each home by continuously setting and providing the appropriate conditionality of the smart earth leakage circuit breaker 100 based on the amount of power used in each home at a unit time interval of 7 days by means of the management server 50. At this time, the conditionality forms a rather large alarm current value when the amount of power used by means of the distribution line 1 is rather high. On the contrary, the conditionality may form a rather small alarm current value when the amount of power used by means of the distribution line 1 is rather low. Based on such an alarm current value, the threshold number and the unit detection period may also be set variously.

According to the smart earth leakage circuit breaker 100 of the present disclosure configured as such, the MPU 20 issues a warning to the surrounding area by means of the alarm unit 30 if set conditionality is satisfied based on detection information. The detection information tracks, by means of the measurement unit 10, a leakage current, which exceeds the alarm current value, based on measurement information of the CT 2. Thus, the smart earth leakage circuit breaker may detect in advance an abnormal symptom of the distribution line 1 through a leakage current less than a rated sensitivity current value generated on the distribution line 1 and may manage and deal with the detected abnormal symptom, so that it is possible to effectively prevent safety accidents caused by a leakage current.

Further, the alarm unit 30 issues a warning by transmitting an alarm and alarm information to a mobile phone set by means of the home IoT 3 installed at home to not only induce a rapid management response of the distribution line 1 but also perform a trip operation by a remote control of the home IoT 3 by means of the management server 50. Thus, safety accidents caused by a leakage current may be completely prevented.

Further, the management server 50 collects and learns big data based on the detection information collected and transmitted from earth leakage circuit breakers installed in a plurality of homes. The management server 50 also sets appropriate conditionality in response to the amount of power used in the distribution line 1 of each home based on the learned information and provides the set conditionality to the MPU 20. Thus, it is possible to induce an earth leakage circuit breaker installed at each home to more effectively detect an abnormal symptom of the distribution line 1 through conditionality.

The technical principle of the smart earth leakage circuit breaker 100 as described above may be extended and also applied to electrical devices or systems such as outlets, an energy storage system (ESS), an uninterruptible power supply (UPS), etc.

The present disclosure has been described with reference to the embodiment illustrated in the accompanying drawings and is just exemplary. The present disclosure is not limited to the above-described embodiments, but it should be appreciated by those having ordinary skill in the art that various modifications and embodiments equivalent thereto can be made therefrom. In addition, modifications by those having ordinary skill in the art can be made without departing from the scope of the present disclosure. Therefore, the scope of the claims in the present disclosure should not be defined within the scope of the detailed description but should be defined by the following claims and the technical spirit thereof.

What is claimed is:

1. A smart earth leakage circuit breaker, installed on a distribution line through which an electric current flows, configured to measure, by means of a current transformer (CT), a leakage current flowing through the distribution line, and when the measured current exceeds a preset rated sensitivity current, configured to cut off electricity by means of trip operation, the smart earth leakage circuit breaker comprising:

a measurement unit configured to track and measure, based on measurement information of the CT, a value of the leakage current flowing through the distribution line, wherein the value of the leakage current exceeds an alarm current value set by a microprocessor;

the microprocessor configured to set conditionality and the alarm current value less than the rated sensitivity current, and when the conditionality is satisfied based on information measured by the measurement unit, configured to issue a warning by means of an alarm unit; and the alarm unit configured to be operated and controlled by the microprocessor and configured to warn of an abnormal symptom of the distribution line by emitting an alarm to the surrounding area, wherein the conditionality set in the microprocessor includes a threshold number of the number of times when the leakage current exceeds the alarm current value through the measurement information of the measurement unit or includes the threshold number and a unit detection period for tracking the threshold number, wherein when the set conditionality is satisfied, the microprocessor transmits alarm information to a home Internet of Things (IoT) through wired/wireless communication to issue a warning to the surrounding area by means of the home IoT, and wherein the home IoT transmits the alarm information to a set phone number input through Wi-Fi.

* * * * *